US012563686B2

(12) United States Patent
Li et al.

(10) Patent No.: US 12,563,686 B2
(45) Date of Patent: Feb. 24, 2026

(54) LGA SOCKET PINS FOR IMPROVED DIFFERENTIAL SIGNALING PERFORMANCE

(71) Applicant: Intel Corporation, Santa Clara, CA (US)

(72) Inventors: Xiang Li, Portland, OR (US); Shaohua Li, Pleasanton, CA (US); Landon Hanks, Milwaukie, OR (US); Kai Xiao, Portland, OR (US); Mo Liu, Santa Clara, CA (US); Jingbo Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 794 days.

(21) Appl. No.: 17/728,099

(22) Filed: Apr. 25, 2022

(65) Prior Publication Data

US 2023/0046581 A1 Feb. 16, 2023

(51) Int. Cl.
*H05K 7/10* (2006.01)
*G06F 13/40* (2006.01)

(52) U.S. Cl.
CPC ......... *H05K 7/1069* (2013.01); *G06F 13/409* (2013.01); *H05K 7/1038* (2013.01); *H05K 7/1084* (2013.01); *G06F 2213/0026* (2013.01); *H05K 2201/10719* (2013.01)

(58) Field of Classification Search
CPC ....... H05K 2201/10719; H05K 7/1038; H05K 7/1069; H05K 7/1084; G06F 13/409; G06F 2213/0026
See application file for complete search history.

(56) References Cited

U.S. PATENT DOCUMENTS

| | | | | |
|---|---|---|---|---|
| 4,988,310 A * | 1/1991 | Bright | ................. | H05K 7/1007 |
| | | | | 439/259 |
| 5,057,031 A * | 10/1991 | Sinclair | ............... | H05K 7/1084 |
| | | | | 439/259 |
| 5,454,727 A * | 10/1995 | Hsu | ...................... | H05K 7/1084 |
| | | | | 439/263 |
| 6,261,114 B1 * | 7/2001 | Shimada | ............. | H05K 7/1084 |
| | | | | 439/268 |
| 10,490,910 B2 * | 11/2019 | Ju | ........................... | H01R 4/02 |
| 10,594,085 B2 * | 3/2020 | Trout | .................. | H01R 25/006 |
| 11,291,133 B2 * | 3/2022 | Zhang | ................. | H01R 12/718 |
| 11,984,683 B2 * | 5/2024 | Matsuoka | ........... | H01R 13/621 |
| 12,176,637 B2 * | 12/2024 | Gieski | ............... | H01R 12/7064 |
| 2005/0277221 A1 * | 12/2005 | Mongold | .......... | H01R 13/6587 |
| | | | | 438/83 |

(Continued)

*Primary Examiner* — Abdullah A Riyami
*Assistant Examiner* — Thang H Nguyen
(74) *Attorney, Agent, or Firm* — Schwegman Lundberg & Woessner, P.A.

(57) ABSTRACT

An apparatus and method for reducing differential cross-talk in a pin arrangement of a socket are described. Socket pins within a differential pair use a modified shape to tighten the intra-pair pin coupling to reduce the crosstalk without changing the pin map. The middle vertical segment of one pin of a diagonally adjacent differential pin pair is modified to be closer to the other pin than other corresponding locations of the pins. The spring beam that extends from the middle vertical segment of the one pin is modified to accommodate the package landing pad that the spring beam contacts to maintain a uniform pitch.

18 Claims, 9 Drawing Sheets

(56)              References Cited

U.S. PATENT DOCUMENTS

2013/0171861 A1*  7/2013  Hayakawa ........... H05K 7/1069
                                                439/372
2019/0148859 A1*  5/2019  Mason .................. H01R 12/79
                                                439/68

* cited by examiner

LGA SOCKET PINS FOR IMPROVED DIFFERENTIAL SIGNALING PERFORMANCE

TECHNICAL FIELD

Embodiments pertain to server systems. In particular, some embodiments relate to improved signal integrity (SI) performance in CPU pin arrangements.

BACKGROUND

The ever-increasing desire for fast performance continues to drive commensurate improvement in software and hardware in individual devices and servers. One such hardware improvement continues to be related to the interface standard for connecting high-speed components such as a central processing unit (CPU) on a motherboard, that is Peripheral Component Interconnect Express (PCIe). The PCIe data rate has grown from 8 Gb/s for Gen1 PCIe to 32 Gb/s for Gen5 and 64 Gb/s for Gen6 PCIe interconnects. With every generation of development, the signal integrity requirement for platform interconnects has become increasingly stringent. The constraint on the form factor of a CPU socket limits the pin count and brings a huge challenge to the pinout arrangement to meet the crosstalk requirement for the socket.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
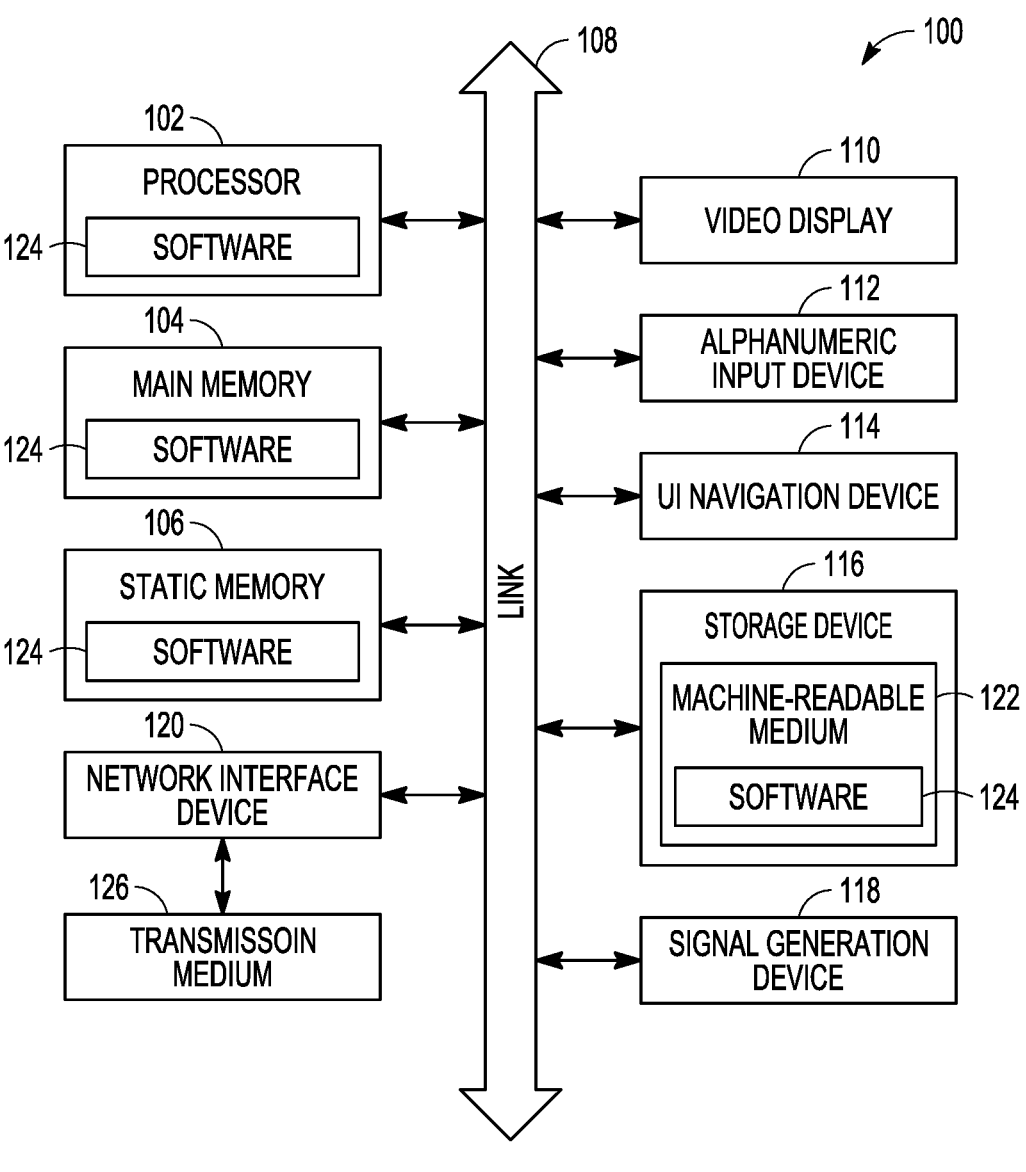
FIG. 1 illustrates a block diagram of a communication device in accordance with some embodiments.

FIG. 1 illustrates a block diagram of a communication device in accordance with some embodiments. The communication device 100 may use the socket described herein. The communication device 100 may be a user equipment (UE) such as a specialized computer, a personal or laptop computer (PC), a tablet PC, or a smart phone, or network equipment such as an NodeB, a server running software to configure the server to, e.g., operate as a network device, or any machine capable of executing instructions (sequential or otherwise) that specify actions to be taken by that machine. Note that although FIG. 1 is shown as a communication device, the embodiments described herein may apply to any electronic device that uses a circuit board.

Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The communication device 100 may include a hardware processor (or equivalently processing circuitry) 102 (e.g., a central processing unit (CPU), a GPU, a hardware processor core, or any combination thereof), a main memory 104 and a static memory 106, some or all of which may communicate with each other via an interlink (e.g., bus) 108. The main memory 104 may contain any or all of removable storage and non-removable storage, volatile memory or non-volatile memory. The communication device 100 may further include a display unit 110 such as a video display, an alphanumeric input device 112 (e.g., a keyboard), and a user interface (UI) navigation device 114 (e.g., a mouse). In an example, the display unit 110, input device 112 and UI navigation device 114 may be a touch screen display. The communication device 100 may additionally include a storage device (e.g., drive unit) 116, a signal generation device 118 (e.g., a speaker), a network interface device 120, and one or more sensors, such as a global positioning system (GPS) sensor, compass, accelerometer, or other sensor. The communication device 100 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 116 may include a non-transitory machine readable medium 122 (hereinafter simply referred to as machine readable medium) on which is stored one or more sets of data structures or instructions 124 (e.g., software) embodying or utilized by any one or more of the techniques or functions described herein. The instructions 124 may also reside, completely or at least partially, within the main memory 104, within static memory 106, and/or within the hardware processor 102 during execution thereof by the communication device 100. While the machine readable medium 122 is illustrated as a single medium, the term "machine readable medium" may include a single medium or multiple media (e.g., a centralized or distributed database, and/or associated caches and servers) configured to store the one or more instructions 124.

The term "machine readable medium" may include any medium that is capable of storing, encoding, or carrying instructions for execution by the communication device 100 and that cause the communication device 100 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 124 may further be transmitted or received over a communications network using a transmission medium 126 via the network interface device 120 utilizing any one of a number of wireless local area network (WLAN) transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), and wireless data networks. Communications over the networks may include one or more different protocols, such as Institute of Electrical and Electronics Engineers (IEEE) 802.11 family of standards known as Wi-Fi, a Long Term Evolution (LTE) family of standards, a Universal Mobile Telecommunications System (UMTS) family of standards, peer-to-peer (P2P) networks, and a next generation (NG)/5$^{th}$ generation (5G) standards, among others. In an example, the network interface device 120 may include one or more physical jacks (e.g., Ethernet, coaxial, or phone jacks) or one or more antennas to connect to the transmission medium 126.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Any of the radio links described herein may operate according to any one or more of the following radio communication technologies and/or standards including but not limited to: a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology (such as 4G, 5G, or 6G), Zigbee, Bluetooth, Wireless Gigabit Alliance (WiGig) standard, mmWave standards in general (wireless systems operating at 10-300 GHz and above such as WiGig, IEEE 802.11ad, IEEE 802.11ay, etc.), technologies operating above 300 GHz and THz bands, (3GPP/LTE based or IEEE 802.11p or IEEE 802.11bd and other) Vehicle-to-Vehicle (V2V) and Vehicle-to-X (V2X) and Vehicle-to-Infrastructure (V2I) and Infrastructure-to-Vehicle (I2V) communication technologies, 3GPP cellular V2X, or DSRC (Dedicated Short Range Communications) communication systems such as Intelligent-Transport-Systems and others.

Aspects described herein can be used in the context of any spectrum management scheme including dedicated licensed spectrum, unlicensed spectrum, license exempt spectrum, (licensed) shared spectrum. Applicable spectrum bands include the IMT spectrum as well as other types of spectrum/bands, such as bands with national allocation, spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 71-76 GHz, 81-86 GHz and 92-94 GHz, etc), Intelligent Transport Systems (ITS) band of 5.9 GHz (typically 5.85-5.925 GHz) and 63-64 GHz, bands currently allocated to WiGig such as WiGig Band 1 (57.24-59.40 GHz), WiGig Band 2 (59.40-61.56 GHz) and WiGig Band 3 (61.56-63.72 GHz) and WiGig Band 4 (63.72-65.88 GHz), 57-64/66 GHz. Furthermore, the scheme can be used on a secondary basis on bands such as the TV White Space bands (typically below 790 MHz) where in particular the 400 MHz and 700 MHz bands are promising candidates. Besides cellular applications, specific applications for vertical markets may be addressed such as Program Making and Special Events (PMSE), medical, health, surgery, automotive, low-latency, drones, etc. applications.

In other embodiments, the embodiments described herein may be used in a server system. The server system contains a motherboard to which a number of devices are connected. These devices include a CPU pin arrangement to which a CPU is connected, multiple random access memory (RAM) slots to which RAM memory is connected, and PCIe slots for connections to various components. The motherboard may be single or double sided, multilayered, flexible and/or rigid, among others. RAM and PCIE slots may be symmetrically placed around the CPU, and the CPU pins may be symmetrically arranged.

The RAM memory may include a number of Dual In-line Memory Modules (DIMMs), as shown Double Data Rate (DDR) DIMMs. The DIMMs include a number of memory components attached to a circuit board (not shown) with pins to provide a connection between the DIMMs and a socket on a motherboard. Other types of DIMMs may be used—for example, Small Outline DIMMs (SODIMMs) or MicroDEVIMs, or Double Data Rate2/3/4 (DDR2/DDR3/DDR4) type DIMMs may be used. The DIMMs may be used to provide Synchronous Dynamic Random Access Memory (SDRAM) for the CPU.

Figure 2A:
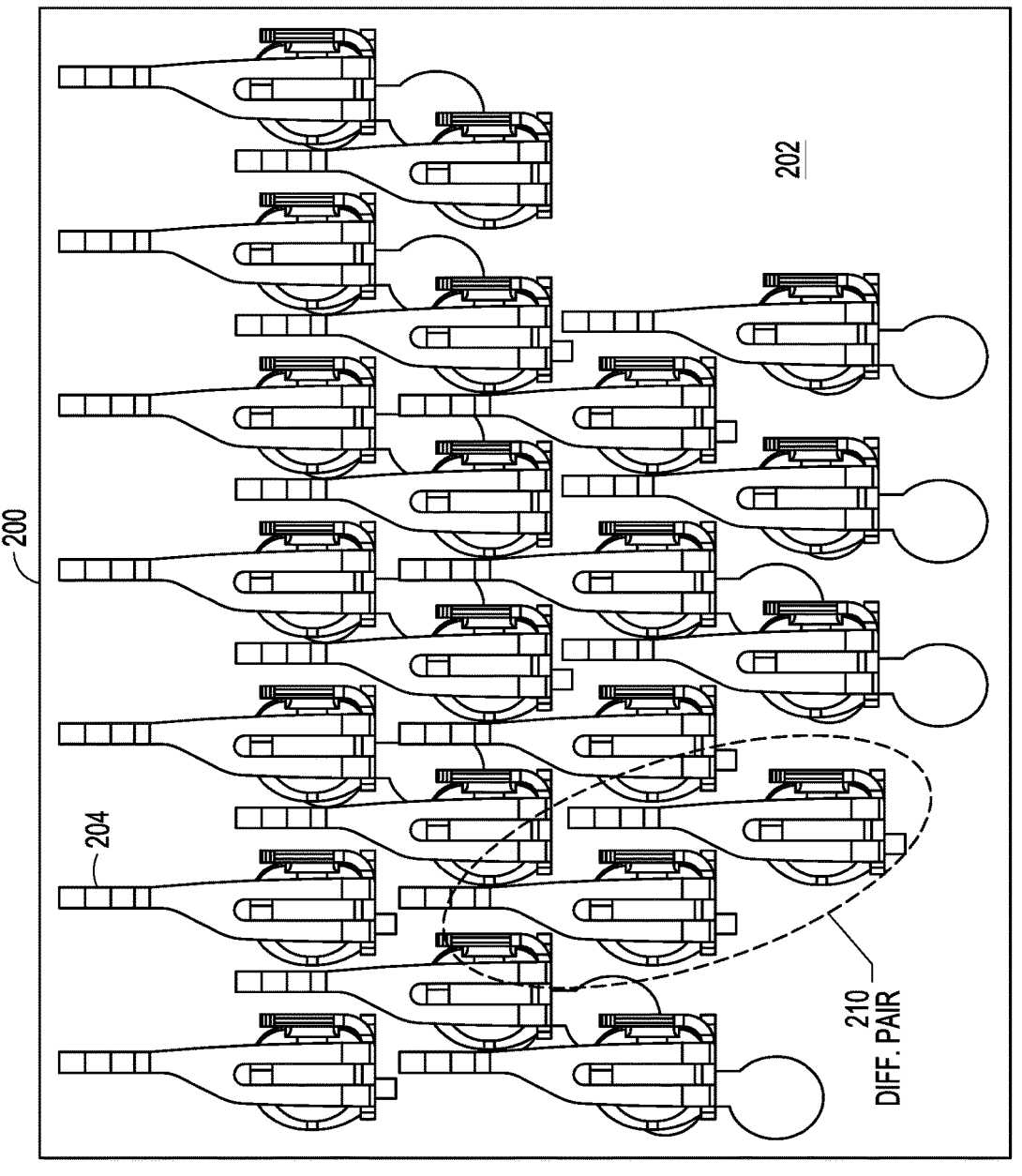
FIG. 2A illustrates a pin arrangement in accordance with accordance with some embodiments.
Figure 2B:
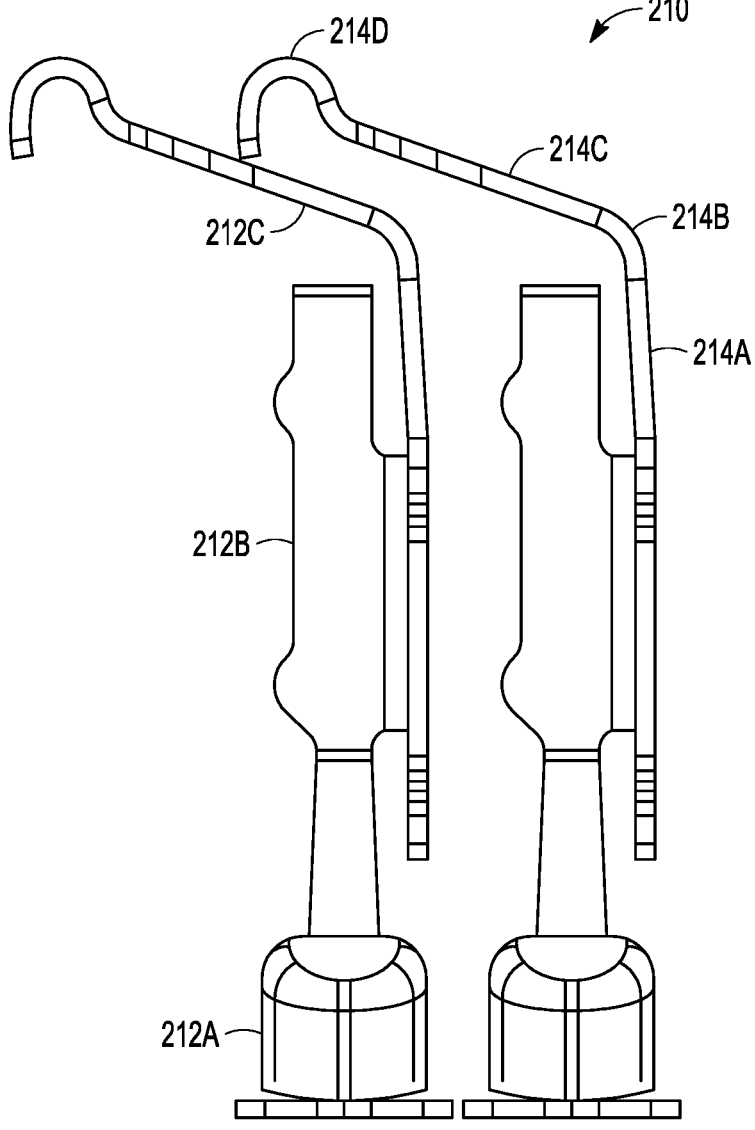
FIG. 2B illustrates a differential pin pair of FIG. 2A in accordance with some embodiments.

FIG. 2A illustrates a pin arrangement in accordance with accordance with some embodiments. In particular, FIG. 2A shows a top view of a pin arrangement 202 of socket pins 204 at the edge of the socket 200. The pin arrangement 202 contains multiple differential socket pin pairs 210. The differential socket pin pairs 210 include one pin that carries a positive signal and the other pin carries a corresponding negative signal (i.e., each of the socket pins 204 of a differential socket pin pair 210 is arranged to carry a differential portion of the same signal). The socket pins 204 may be landing grid array (LGA) socket pins, and the socket 200 may support PCIe Gen5. As shown in FIGS. 2A and 2B, all the pins 204 in the socket 200 have a uniform pin shape and orientation. The pin arrangement 202 and socket pins 204 may be designed for a CPU, for example.

FIG. 2B illustrates a differential pin pair of FIG. 2A in accordance with some embodiments. FIG. 2B illustrates a side view of a LGA socket pin according to some embodiments. The differential socket pin pairs 210 contains two socket pins 204 formed from a flexible conductive material, such as metal. Each socket pin 204 of the differential socket pin pairs 210 includes a spring beam 212c, a main body 212b, and a lower connector 212a. The spring beam 212c is configured to contact to a device package, in particular a specific contact LGA contact pad 216 (of a CPU for example). The spring beam 212c may have any shape to connect to the device package.

In particular, the spring beam 212c multiple sections that include a base 214a coupled to the main body 212b, an arm 214c, a bent connector 214b that couples the base 214a and the arm 214c, and a hook 214d at the end of the arm 214c. The hook 214d is formed in a substantially semi-circular shape and configured to make pressure contact with the pad of the CPU package. The arm 214c extends in a substantially straight manner from the bent connector 214b to the hook 214d. The arm 214c increases in width from the hook 214d to a point at which the arm 214c separates into two portions of equal width with a gap therebetween. The bent connector 214b similarly is formed from two portions having the same width and the gap therebetween. The bent connector 214b is bent at an obtuse angle.

The main body 212b of the LGA socket pin 204 includes a single conductive material bent into two substantially perpendicular sides, one of which is coupled to the base 214a. Thus, the main body 212b is substantially L-shaped with approximately equal widths. The base 214a is coupled to one of the sides of the main body 212b. The other side of the main body 212b is coupled to the lower connector 212a. In particular, the lower connector 212a may be soldered to a PCB (or other electronic component, such as an interposer) via a solder ball, although other types of electrical connection may be used (e.g., wires, solder bump, pads). The LGA socket pin 204 thus connects to a (underlying) electronic circuit (which may be on/in the PCB) through the lower connector 212a. The main body 212b of the differential pair 210 has the most planar area and thus the strongest coupling and contributes to most of the crosstalk.

As shown in FIGS. 2A and 2B, the differential socket pin pairs 210 may be laterally or diagonally adjacent or may be separated by other socket pins 204 such as a ground pin (that provides ground to the device, e.g., CPU). Regardless of the relative positions of the socket pins 204, however, a constant distance is maintained between corresponding locations of the socket pins 204 in the differential socket pin pairs 210. As used herein, corresponding locations are similar locations of the socket pins 204 (e.g., sides of the main body 212b, hook 214d), which have the same general shape. In some embodiments, a location may be defined by the relative location within a particular socket pin 204 (e.g., hook 214d terminates the spring beam 212c and extends from the arm 214c).

Figure 3B:
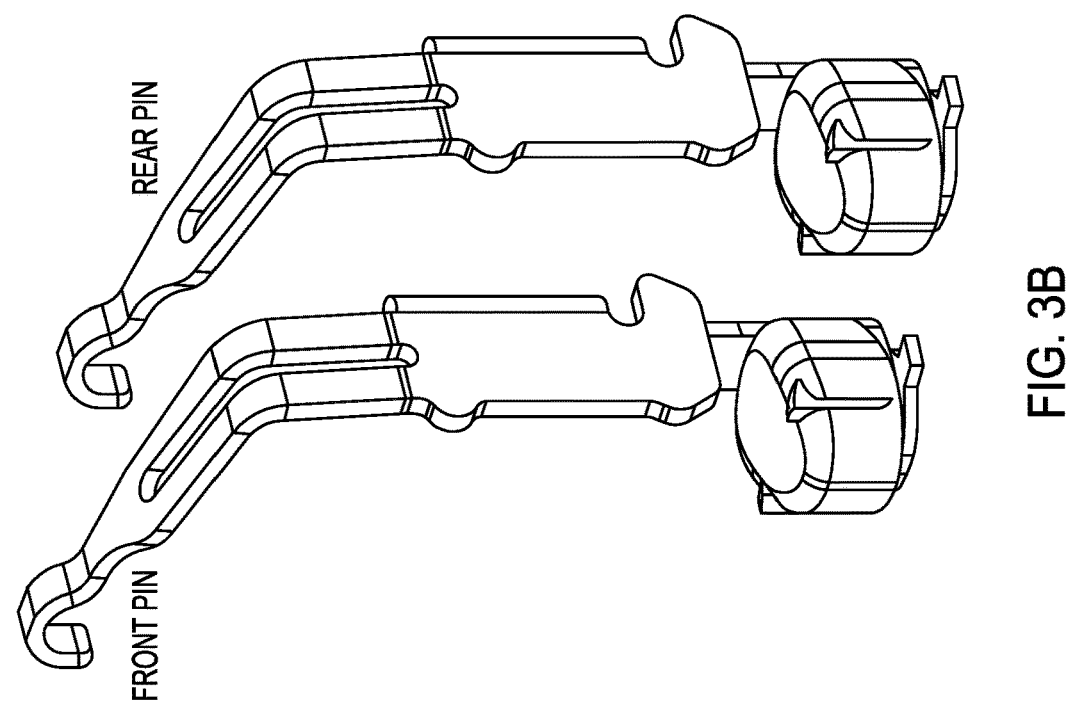
FIG. 3B illustrates an isometric view of the differential pin pair of FIG. 3A according to some embodiments.
Figure 3A:
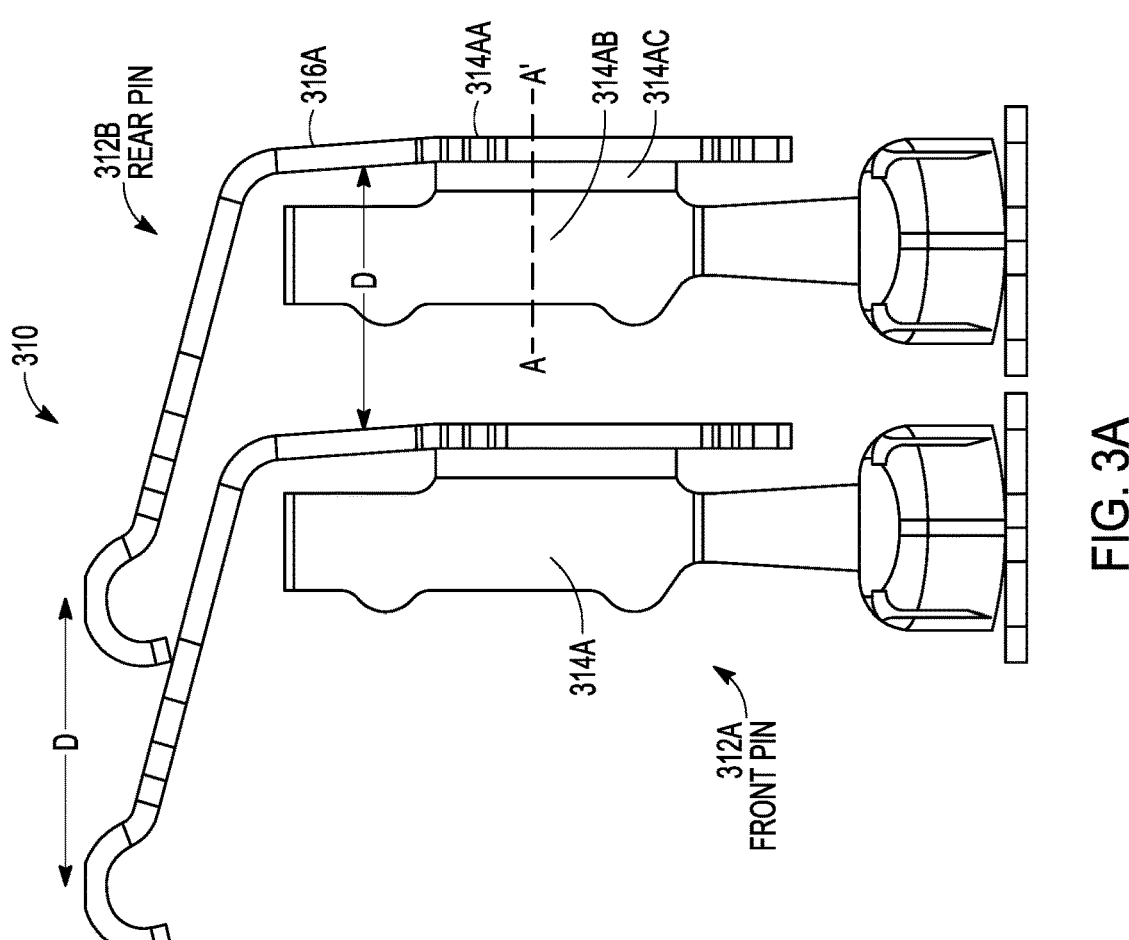
FIG. 3A illustrates a side view of a differential pin pair according to some embodiments.

FIG. 3A illustrates a side view of a differential pin pair according to some embodiments. FIG. 3B illustrates an isometric view of the differential pin pair of FIG. 3A according to some embodiments. The side view of the differential pin pair 310 is similar to that of FIG. 2B. In particular, the differential pin pair 310 includes a front pin 312a and a rear pin 312b that are diagonally adjacent, similar to the differential pair 210. The front pin 312a and a rear pin 312b maintain a constant distance D between corresponding locations, including the base 314a. Each base 314a has a substantially "L" shape cross-section along line A-A', with the base 314a being bent to have first and second base portions 314aa, 314ab that are substantially perpendicular and connected by a curved portion 314ac. The base 316a of the spring beam is coupled to the first base portion 314aa.

Figures 3C, 3D:
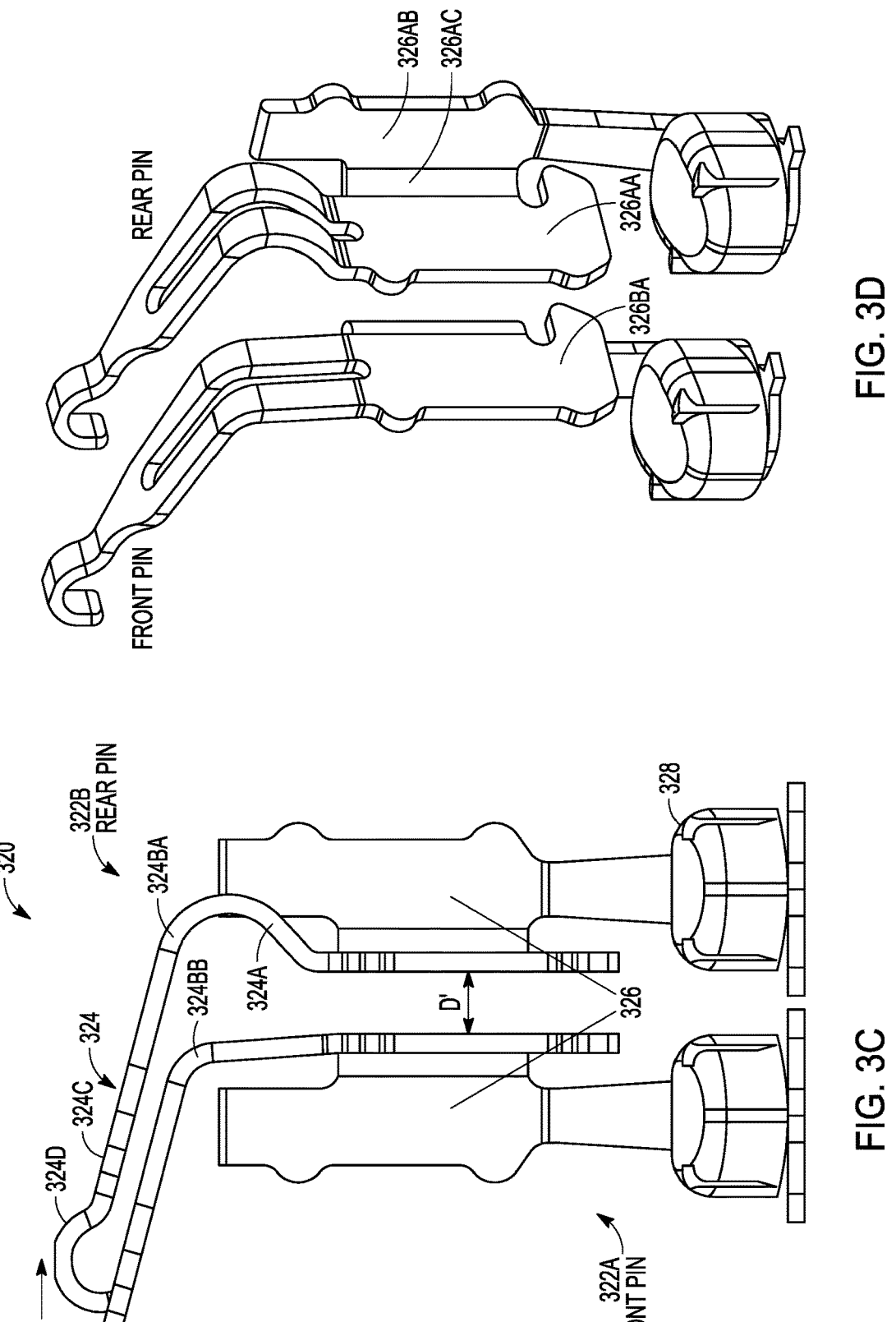
FIG. 3C illustrates a side view of another differential pin pair according to some embodiments.
FIG. 3D illustrates an isometric view of the differential pin pair of FIG. 3D according to some embodiments.

FIG. 3C illustrates a side view of another differential pin pair according to some embodiments. FIG. 3D illustrates an isometric view of the differential pin pair of FIG. 3D according to some embodiments. The differential pin pair 320 includes a front pin 322a and a rear pin 322b that are diagonally adjacent.

Each of front pin 322a and a rear pin 322b includes a spring beam 324, a main body 326, and a lower connector 328. The spring beam 324 multiple sections that include a beam base 324a coupled to the main body 326, an arm 324c, a bent connector 324ba, 324bb that couples the beam base 324a and the arm 324c, and a hook 324d at the end of the arm 324c. The hook 324d is formed in a substantially semi-circular shape and configured to make pressure contact with the pad of the CPU package. The arm 324c extends in a substantially straight manner from the bent connector 324ba, 324bb to the hook 324d. The arm 324c increases in width from the hook 324d to a point at which the arm 324c separates into two portions of equal width with a gap therebetween. The bent connector 324*ba*, 324*bb* similarly is formed from two portions having the same width and the gap therebetween.

The main body 326 includes a single conductive material bent into two substantially perpendicular sides, one of which is coupled to the beam base 324*a* of the spring beam 324. The main body 326 is substantially L-shaped with approximately equal widths. The beam base 324*a* is coupled to one of the main body sides 326*aa*, 326*ba*. The other of the main body sides 326*ab* is coupled to the lower connector 328. Each of the one of the main body sides 326*aa*, 326*ba* is substantially planar and connected to the other of the main body side 326*ab* through a curved portion 326*ac* that is substantially smaller than either of the main body sides 326*aa*, 326*ba*. The lower connector 328 may be soldered to a motherboard via a solder ball.

As above, the main body 326 of the differential pair 320 has the most planar area and thus strongest coupling with and contributes most of the crosstalk. Both the main bodies 326 of the front pin 322*a* and a rear pin 322*b* of the differential pair 320 have an "L" shaped cross-section, however, the main bodies 326 are oriented differently. In particular, the main body side 326*aa* of the rear pin 322*b* to which the beam base 324*a* is connected is mirrored (i.e., bent 180 degrees the opposite direction) from the main body side 326*ba* of the front pin 322*a* to which the beam base 324*a* is connected so that one of the main bodies 326 effectively has an "L" shaped cross-section and the other effectively has a mirrored "L" shaped cross-section.

Because of the mirroring, the front pin 322*a* and a rear pin 322*b* thus do not maintain a constant distance between corresponding locations; the distance D' between the main body side 326*aa* of the rear pin 322*b* and the main body side 326*ba* of the front pin 322*a* is substantially less than the distance D between the hook 324*d* of the rear pin 322*b* and the front pin 322*a*. The distance D between the hook 324*d* of the rear pin 322*b* and the front pin 322*a* is the distance between the contacts (landing pad) of the package, which may be uniform in the pin arrangement. The entire surfaces of the main body side 326*aa* of the rear pin 322*b* and the main body side 326*ba* of the front pin 322*a* (which account for most of the cross-talk) are thus closer, increasing the electromagnetic coupling and reducing the cross-talk between the rear pin 322*b* and the front pin 322*a*. Specifically, the difference between the original distance (D)/the distance between the hook 324*d* of the rear pin 322*b* and the front pin 322*a* and the distance D' between the main body side 326*aa* of the rear pin 322*b* and the main body side 326*ba* of the front pin 322*a* is about the width of the other of the main body sides 326*ab* (as the main body side 326*aa* is effectively on the opposite side of the other of the main body sides 326*ab*). Alternatively, a difference between a minimum distance (D') and maximum distance (D) between the corresponding locations of the front and rear pins 322*a*, 322*b* is about a width of the other of the main body sides 326*ab* (i.e., the width in the direction A-A').

To enable the change in distance while retaining the same length of the conductor that forms the spring beam 324, the bent connectors 324*ba*, 324*bb* are bent differently. Specifically, the bent connector 324*ba* of the rear pin 322*b* is first bent at the main body side 326*aa* backward away from the hook 324*d* prior to being bent toward the hook 324*d*. Accordingly, while the bent connector 324*bb* of the front pin 322*a* remains bent at an obtuse angle, the bent connector 324*ba* of the rear pin 322*b* may be bent at an acute angle, substantially a right angle, or an obtuse angle, as desired. In other words, the radius of curvature of the bent connector

324*ba* of the rear pin 322*b* is less than that of the bent connector 324*bb* of the front pin 322*a*; the beam base 324*a* extends substantially linearly from the main body side 326*ba* in the front pin 322*a* while the beam base 324*a* initially curves from the main body side 326*aa* in the rear pin 322*b* backwards away from the hook 324*d* and towards a center (or central plane) of the rear pin 322*b*. In some embodiments, elements other than the bent connector 324*ba*, 324*bb*, the main body side 326*aa*, 326*ba*, and the curved portion 326*ac* may remain the same between the rear pin 322*b* and the front pin 322*a* in both size and orientation.

Figure 4A:
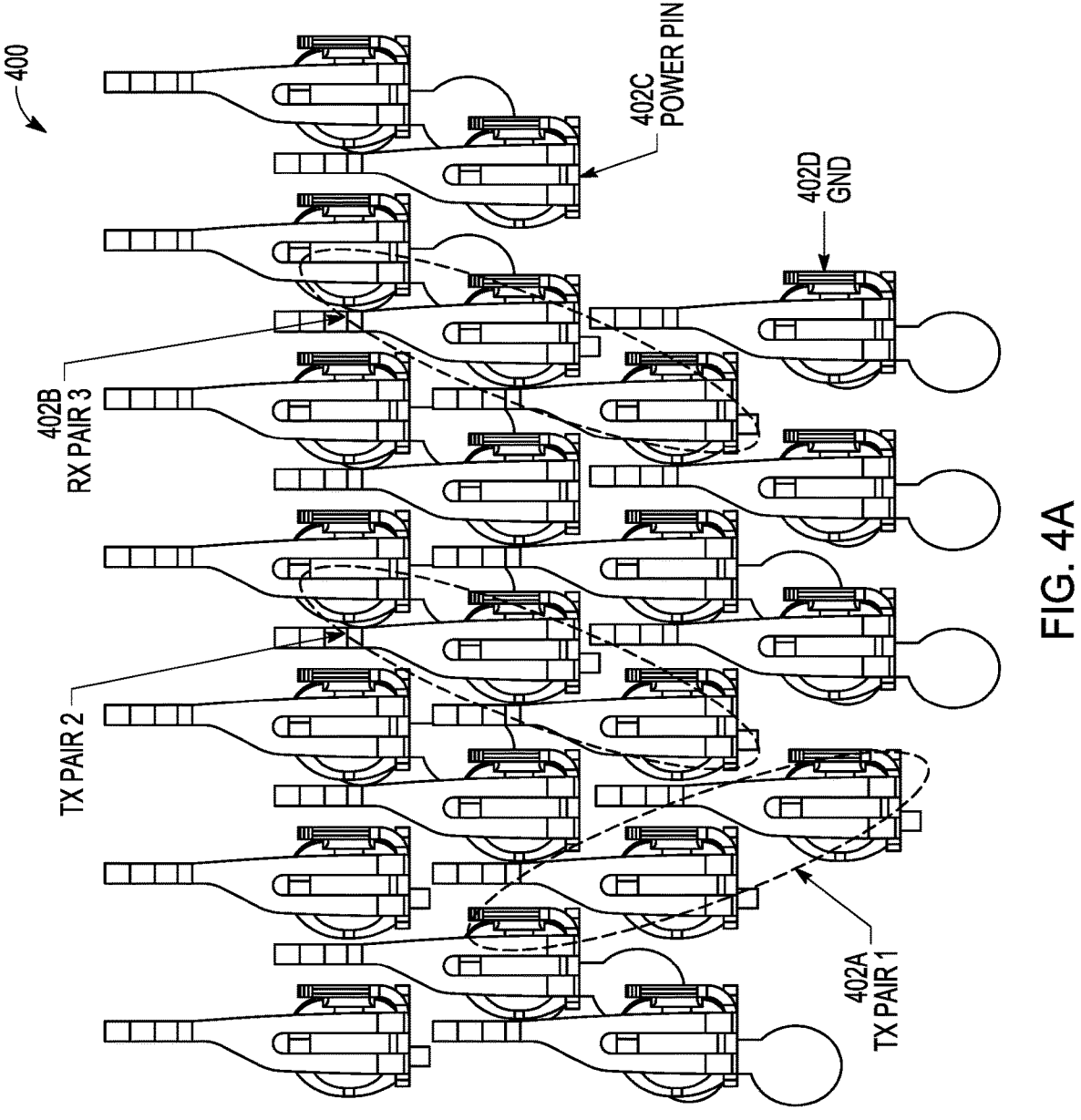
FIG. 4A illustrates a pin arrangement according to some embodiments.
Figure 4B:
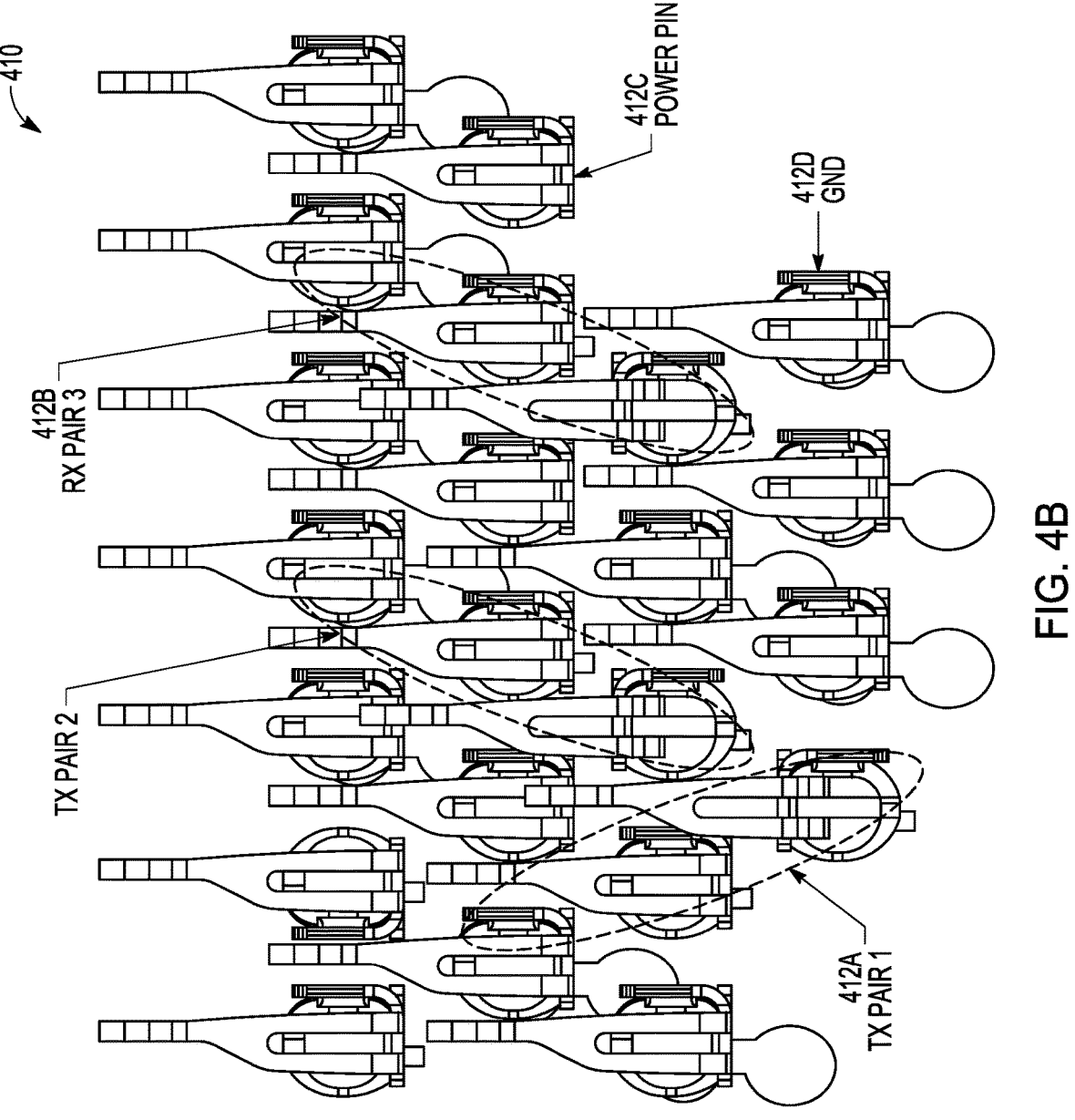
FIG. 4B illustrates another pin arrangement according to some embodiments.

FIG. 4A illustrates a pin arrangement according to some embodiments. FIG. 4B illustrates another pin arrangement according to some embodiments. As shown in FIG. 4A, multiple transmit (TX) pin pairs 402*a* and receive (RX) pin pairs 402*b*, as well as power pins 402*c* and ground (GND) pins 402*d* are present in the pin arrangement 400 in which both the front and rear pins have the same shape. Similarly, as shown in FIG. 4B, multiple TX pin pairs 412*a* and RX pin pairs 412*b*, as well as power pins 412*c* and GND pins 412*d* are present in the pin arrangement 410 but in which both the front and rear pins have different shapes in only one of the pin pairs (TX pair 1). The overall pin arrangements 400, 410 are the same between FIGS. 4A and 4B; the relative locations of the different types of pins remain the same. As readily apparent, the base of the pin pairs (e.g., TX pair 1 402*a*, 412*a*) are closer in FIG. 4B than FIG. 4A. However, because of the form factor limit of a socket, high speed input/output (I/O) pins in the pin arrangement 410 may, in some embodiments, be limited to the edge of the pin arrangement 410. This may not be preferred from a SI point of view, where crosstalk can be higher than those of inner pins. In embodiments in which the form factor is more flexible, the different pin pairs (having the modified structure) may not have such a location limitation. The amount of crosstalk may be determined by the pin geometry, pinout arrangement, and socket housing material.

Figures 5A, 5B:
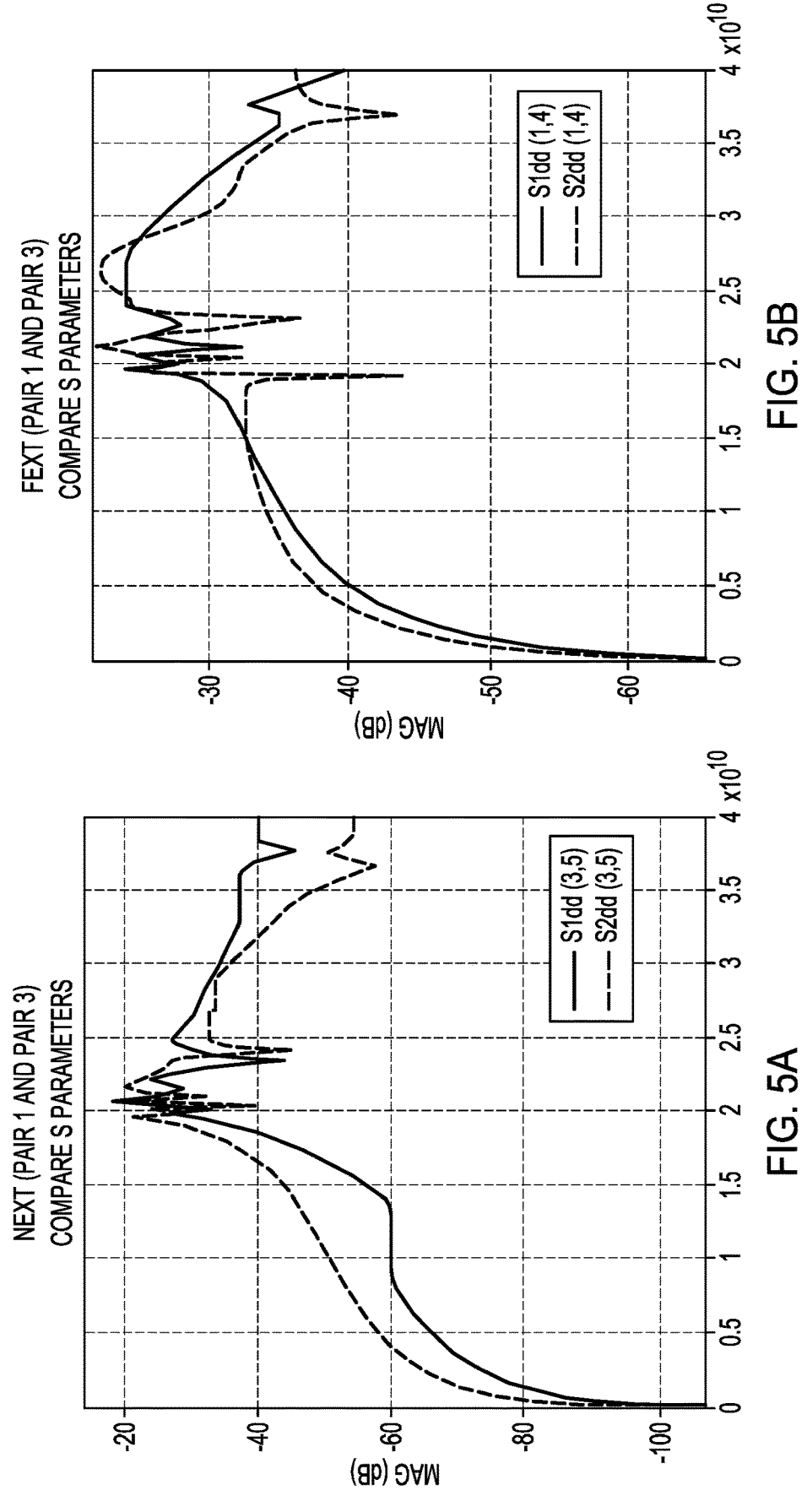
FIG. 5A illustrates a near end cross-talk (NEXT) comparison according to some embodiments.
FIG. 5B illustrates a far end cross-talk (FEXT) comparison according to some embodiments.

FIG. 5A illustrates a NEXT comparison according to some embodiments. FIG. 5A shows the NEXT before and after the pin shape modification in the edge differential pairs in FIG. 4B. As can be seen, all of the NEXT curves show improvement after pin shape optimization in the differential pairs. The biggest NEXT improvement happens between pair 2 and pair 3, and the NEXT is improved by 15 dB. With the pin shape change, the NEXT level for all the edge differential pairs is now close to or lower than −50 dB for the frequency range of 0-16 GHz, meeting the design target for PCIe Gen5.

FIG. 5B illustrates a FEXT comparison according to some embodiments. The FEXT for both pin arrangements are similar; the FEXT between pair 1 and pair 2 was determined to have a few dB improvement.

Benefit of NEXT from the modified socket pins described herein was evaluated on a 3-connector cable topology of PCIe Gen5 with reference receiver. Table 1 shows the eye margin improvement from NEXT only (FEXT is excluded) is about 3 my and 4% UI, which is about 8.6% EH and 7.3% EW improvement. This may lead to about 2" more extension on PCB routing. The package length is assumed to be 30 mm in the simulation. With shorter aggressor's package length, for example 10 mm, NEXT impact can be bigger and can be riskier for platform design. Reducing the NEXT from socket pin provides flexibility of package routing length.

TABLE 1

| Eye margin improvement from socket NEXT reduction on a 3-connector PCIe Gen5 topology (FEXT excluded in the simulation) | | | | |
|---|---|---|---|---|
| | Maximum Eye Height (mv) | Maximum Eye Width (UI) | Delta EH | Delta EW |
| Original pin shape | 35 | 0.55 | | |
| Modified rear pin shape to have tight coupling with front pin | 38 | 0.59 | 3 mv | 4% UI |

The pin arrangement described herein can thus reduce crosstalk between adjacent signals in a socket (by tightening the intra-pair pin coupling) without changing the pin map or using extra ground pins. It improves signal integrity and efficiency of pin usage.

Figure 6:
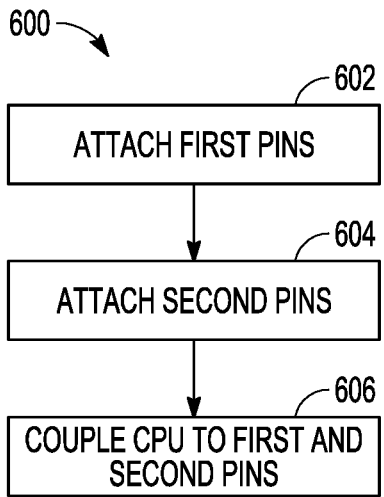
FIG. 6 illustrates a method of fabricating the server system according to some embodiments.

FIG. 6 illustrates a method of fabricating a socket according to some embodiments. The method 600 of FIG. 6 may provide operations related to the pin arrangement for high speed (defined as PCIe Gen 5.0 or greater; greater than about 4 GB/s throughput for a x1 slot) I/O interactions on a motherboard (PCB), such as for a CPU; additional operations may be present, including operations related to fabricating PCIe and/or DIMMs slots, as well as attaching various components to the motherboard. At operation 602, a first set of pins are attached to the socket. The first set of pins may have a middle vertical segment with a substantially "L" shaped cross-section oriented in a first direction.

At operation 604, a second set of pins are attached to the socket. Each of the second set of pins may be provided as completion of a differential pair with one of the first set of pins. The individual pins of the differential pair may be diagonally adjacent to each other. At least one of the second set of pins may have a middle vertical segment with a substantially "L" shaped cross-section oriented in a second direction that is mirrored with that of the first set of pins and arranged to permit the middle vertical segment of each differential pair to be closer to each other than pins having middle vertical segment with the same orientation. The first and second sets of pins may be attached to the socket at lower ends of the pins. The first and second sets of pins may be fabricated by, e.g., stamping the conductive material and then bending the stamped conductive material into the desired shape. In some embodiments, all of the differential pairs may use the sets of pins with different middle vertical segments. In other embodiments, the use of the pins with different middle vertical segment may be limited to specific locations due to the socket form factor. For example, the use of such pins may be limited to differential pairs near the edge of the pin arrangement (i.e., within up to about 10 pins from the outermost pin of the pin arrangement). The use may also be limited to diagonally adjacent differential pin pairs. Either or both TX or RX diagonally adjacent differential pin pairs may be modified.

After the first and second sets of pins have been attached to the socket, a CPU or other device can then be inserted at operation 606. The CPU may be coupled to the first and second sets of pins through a socket or interposer, for example.

EXAMPLES

Example 1 is an apparatus for a socket, the apparatus comprising a pin arrangement in the socket, the pin arrangement including an adjacent differential pin pair comprising a front pin and a rear pin that have substantially similar shapes, the adjacent differential pin pair having a distance between corresponding locations of the front and rear pins that varies with location on the front and rear pins.

In Example 2, the subject matter of Example 1 includes that each of the front and rear pins includes: a main body having an asymmetric cross-section, and a spring beam that extends from the main body, the spring beam configured to contact a contact pad inserted into the socket.

In Example 3, the subject matter of Example 2 includes that the asymmetric cross-section has substantially orthogonal sides in a substantial "L" shape.

In Example 4, the subject matter of Examples 2-3 includes that: for each of the front and rear pins: the main body includes a first side and a second side connected by a curved portion, the first and second side being substantially planar, and the spring beam extends from the first side, and the main bodies of the front and rear pins have mirrored cross-sections.

In Example 5, the subject matter of Example 4 includes that: the spring beam of each of the front and rear pins includes a hook configured to contact the contact pad, and a distance between the hook of the front and rear pins is larger than a distance between the first side of the front and rear pins.

In Example 6, the subject matter of Examples 4-5 includes that: the spring beam of the front pin further includes a front beam base that extends substantially linearly from the first side of the front pin, and the spring beam of the rear pin further includes a rear beam base that initially curves from the first side of the rear pin backwards towards a center of the rear pin.

In Example 7, the subject matter of Examples 4-6 includes that: the spring beam of each of the front and rear pin further includes a bent connector, and a radius of curvature of the bent connector of the front pin is larger than a radius of curvature of the rear pin.

In Example 8, the subject matter of Examples 2-7 includes that: for each of the front and rear pins: the main body includes a first side and a second side connected by a curved portion, the first and second side being substantially planar, and the spring beam extends from the first side, and a difference between a minimum distance and maximum distance between the corresponding locations of the front and rear pins is about a width of the second side.

In Example 9, the subject matter of Examples 1-8 includes that the adjacent differential pin pair is limited to a pin pair disposed at an edge of the socket, each of the front and rear pin of the adjacent differential pin pair is arranged to carry a differential portion of a same signal.

In Example 10, the subject matter of Examples 1-9 includes that the adjacent differential pin pair is a diagonally adjacent pin pair, each of the front and rear pin of the adjacent differential pin pair is arranged to carry a differential portion of a same signal.

In Example 11, the subject matter of Examples 1-10 includes that: the pin arrangement includes transmit pairs, receive pairs, a power pin, and ground pins, and the adjacent differential pin pair is one of the transmit pairs or receive pairs.

In Example 12, the subject matter of Examples 1-11 includes that the adjacent differential pin pair is a high speed communication differential pin pair, each of the front and rear pin of the adjacent differential pin pair is arranged to carry a differential portion of a same signal.

Example 13 is an apparatus for a Peripheral Component Interconnect Express (PCIe) 5th Generation (Gen5.0) or later socket, the apparatus comprising a pin arrangement in the socket, the pin arrangement including a plurality of differential pin pairs that include, transmit pairs and receive pairs, one of the differential pin pairs comprising an adjacent differential pin pair for high speed communications, the adjacent differential pin pair including a front pin and a rear pin, the adjacent differential pin pair having middle vertical sections that are substantially closer to each other than other corresponding sections of the adjacent differential pin pair are to each other.

In Example 14, the subject matter of Example 13 includes that for each of the front and rear pins: the middle vertical section is formed from substantially orthogonal sides, and a spring beam extends from a first side of the substantially orthogonal sides, the spring beam configured to contact a contact pad inserted into the socket, and the middle vertical sections of the front and rear pins have cross-sections that are mirrored from each other.

In Example 15, the subject matter of Example 14 includes that: the spring beam of each of the front and rear pins includes a hook configured to contact the contact pad, the spring beam of the front pin further includes a front beam base that extends substantially linearly from the first side of the front pin, and the spring beam of the rear pin further includes a rear beam base that initially curves from the first side of the rear pin backwards towards a center of the rear pin, and a distance between the hook of the front and rear pins is larger than a distance between the first side of the front and rear pins.

In Example 16, the subject matter of Examples 14-15 includes that a difference between a minimum distance and maximum distance between corresponding locations of the front and rear pins is about a width of one of the substantially orthogonal sides.

In Example 17, the subject matter of Examples 13-16 includes that the adjacent differential pin pair is limited to a pin pair disposed at an edge of the socket.

In Example 18, the subject matter of Examples 13-17 includes that the adjacent differential pin pair is a diagonally adjacent pin pair.

Example 19 is a method of fabricating a Peripheral Component Interconnect Express (PCIe) 5th Generation (Gen5.0) or later socket, the method comprising: attaching a first set of pins in a pin arrangement of the socket, the first set of pins having a middle vertical segment with a substantially "L" shaped cross-section oriented in a first direction; and attaching a second set of pins in the pin arrangement of the socket, each pair of the first and second set of pins providing a differential pair, one of the differential pairs having a front pin and a rear pin that are diagonally adjacent to each other, the front pin and the rear pin each having a middle vertical segment with adjoining substantially orthogonal sides, the middle vertical segments having mirrored orientations from each other and aligned to be closer to each other than pins having middle vertical segments with a same orientation.

In Example 20, the subject matter of Example 19 includes that: the front pin and the rear pin each include a spring beam that extends from a first side of the substantially orthogonal sides, the spring beam of each of the front and rear pins includes a hook configured to contact a conductive pad inserted into the socket, the spring beam of the front pin further includes a front beam base that extends substantially linearly from the first side of the front pin, the spring beam of the rear pin further includes a rear beam base that initially curves from the first side of the rear pin backwards towards a center of the rear pin, and a distance between the hook of the front and rear pins is larger than a distance between the first side of the front and rear pins.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus for a socket, the apparatus comprising a pin arrangement in the socket, the pin arrangement including an adjacent differential pin pair comprising a front pin and a rear pin that have substantially similar shapes, the adjacent differential pin pair having a distance between corresponding locations of the front and rear pins that varies with location on the front and rear pins,
wherein:
    the pin arrangement includes transmit pairs, receive pairs, a power pin, and ground pins, and
    the adjacent differential pin pair is one of the transmit pairs or receive pairs.

2. The apparatus of claim 1, wherein each of the front and rear pins includes:
a main body having an asymmetric cross-section, and
a spring beam that extends from the main body, the spring beam configured to contact a contact pad inserted into the socket.

3. The apparatus of claim 2, wherein the asymmetric cross-section has substantially orthogonal sides in a substantial "L" shape.

4. The apparatus of claim 2, wherein:
for each of the front and rear pins:
    the main body includes a first side and a second side connected by a curved portion, the first and second side being substantially planar, and
    the spring beam extends from the first side, and
the main bodies of the front and rear pins have mirrored cross-sections.

5. The apparatus of claim 4, wherein:
the spring beam of each of the front and rear pins includes a hook configured to contact the contact pad, and
a distance between the hook of the front and rear pins is larger than a distance between the first side of the front and rear pins.

6. The apparatus of claim 4, wherein:
the spring beam of the front pin further includes a front beam base that extends substantially linearly from the first side of the front pin, and
the spring beam of the rear pin further includes a rear beam base that initially curves from the first side of the rear pin backwards towards a center of the rear pin.

7. The apparatus of claim 4, wherein:
the spring beam of each of the front and rear pin further includes a bent connector, and
a radius of curvature of the bent connector of the front pin is larger than a radius of curvature of the rear pin.

8. The apparatus of claim 2, wherein:
for each of the front and rear pins:
    the main body includes a first side and a second side connected by a curved portion, the first and second side being substantially planar, and
    the spring beam extends from the first side, and a difference between a minimum distance and maximum distance between the corresponding locations of the front and rear pins is about a width of the second side.

9. The apparatus of claim 1, wherein the adjacent differential pin pair is limited to a pin pair disposed at an edge of the socket, each of the front and rear pin of the adjacent differential pin pair is arranged to carry a differential portion of a same signal.

10. The apparatus of claim 1, wherein the adjacent differential pin pair is a diagonally adjacent pin pair, each of the front and rear pin of the adjacent differential pin pair is arranged to carry a differential portion of a same signal.

11. The apparatus of claim 1, wherein the adjacent differential pin pair is a high speed communication differential pin pair, each of the front and rear pin of the adjacent differential pin pair is arranged to carry a differential portion of a same signal.

12. An apparatus for a Peripheral Component Interconnect Express (PCIe) $5^{th}$ Generation (Gen5.0) or later socket, the apparatus comprising a pin arrangement in the socket, the pin arrangement including a plurality of differential pin pairs that include transmit pairs and receive pairs, one of the differential pin pairs comprising an adjacent differential pin pair for high speed communications, the adjacent differential pin pair including a front pin and a rear pin, the adjacent differential pin pair having middle vertical sections that are substantially closer to each other than other corresponding sections of the adjacent differential pin pair are to each other,
wherein for each of the front and rear pins:
    the middle vertical section is formed from substantially orthogonal sides,
    a spring beam extends from a first side of the substantially orthogonal sides, the spring beam configured to contact a contact pad inserted into the socket, and
    the middle vertical sections of the front and rear pins have cross-sections that are mirrored from each other.

13. The apparatus of claim 12, wherein:
the spring beam of each of the front and rear pins includes a hook configured to contact the contact pad,
the spring beam of the front pin further includes a front beam base that extends substantially linearly from the first side of the front pin,
the spring beam of the rear pin further includes a rear beam base that initially curves from the first side of the rear pin backwards towards a center of the rear pin, and
a distance between the hook of the front and rear pins is larger than a distance between the first side of the front and rear pins.

14. The apparatus of claim 12, wherein a difference between a minimum distance and maximum distance between corresponding locations of the front and rear pins is about a width of one of the substantially orthogonal sides.

15. The apparatus of claim 12, wherein the adjacent differential pin pair is limited to a pin pair disposed at an edge of the socket.

16. The apparatus of claim 12, wherein the adjacent differential pin pair is a diagonally adjacent pin pair.

17. A method of fabricating a Peripheral Component Interconnect Express (PCIe) $5^{th}$ Generation (Gen5.0) or later socket, the method comprising:
attaching a first set of pins in a pin arrangement of the socket, the first set of pins having a middle vertical segment with a substantially "L" shaped cross-section oriented in a first direction; and
attaching a second set of pins in the pin arrangement of the socket, each pair of the first and second set of pins providing a differential pair, one of the differential pairs having a front pin and a rear pin that are diagonally adjacent to each other, the front pin and the rear pin each having a middle vertical segment with adjoining substantially orthogonal sides, the middle vertical seg- ments having mirrored orientations from each other and aligned to be closer to each other than pins having middle vertical segments with a same orientation.

18. The method of claim 17, wherein:

the front pin and the rear pin each include a spring beam that extends from a first side of the substantially orthogonal sides, the spring beam of each of the front and rear pins includes a hook configured to contact a conductive pad inserted into the socket, the spring beam of the front pin further includes a front beam base that extends substantially linearly from the first side of the front pin, the spring beam of the rear pin further includes a rear beam base that initially curves from the first side of the rear pin backwards towards a center of the rear pin, and a distance between the hook of the front and rear pins is larger than a distance between the first side of the front and rear pins.

* * * * *